(12) United States Patent
Yang

(10) Patent No.: US 8,629,491 B2
(45) Date of Patent: Jan. 14, 2014

(54) SEMICONDUCTOR MEMORY DEVICE AND METHOD OF MANUFACTURING THE SAME

(75) Inventor: Jae Wook Yang, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/600,966

(22) Filed: Aug. 31, 2012

(65) Prior Publication Data

US 2013/0099302 A1 Apr. 25, 2013

(30) Foreign Application Priority Data

Oct. 24, 2011 (KR) .................. 10-2011-0108893

(51) Int. Cl.
*H01L 29/788* (2006.01)

(52) U.S. Cl.
USPC ........... 257/321; 257/316; 257/315; 257/314; 257/E29.129; 257/E29.3; 257/E21.209; 438/257

(58) Field of Classification Search
None
See application file for complete search history.

(56) References Cited

U.S. PATENT DOCUMENTS

| 6,228,717 B1 | 5/2001 | Hazama et al. |
| 2008/0142870 A1* | 6/2008 | Watanabe ..................... 257/316 |
| 2009/0233406 A1* | 9/2009 | Shon ............................ 438/264 |

FOREIGN PATENT DOCUMENTS

KR 1020040076982 9/2004

* cited by examiner

*Primary Examiner* — Julio J Maldonado
*Assistant Examiner* — Molly Reida
(74) *Attorney, Agent, or Firm* — IP & T Group LLP

(57) ABSTRACT

A semiconductor memory device according to embodiment of the present invention includes a tunnel insulating layer formed over a semiconductor substrate, a floating gate formed over the tunnel insulating layer, a dielectric layer formed over the floating gate, and a control gate including a third silicon layer formed over the dielectric layer, a fourth silicon layer formed over the third silicon layer, and a conductive layer formed over the fourth silicon layer, wherein the fourth silicon layer has a greater width than the third silicon layer.

17 Claims, 3 Drawing Sheets

SEMICONDUCTOR MEMORY DEVICE AND METHOD OF MANUFACTURING THE SAME

CROSS-REFERENCE TO RELATED APPLICATION

Priority is claimed to Korean patent application number 10-2011-0108893 filed on Oct. 24, 2011, the entire disclosure of which is incorporated herein by reference in its entirety.

BACKGROUND

1. Field of Invention

Embodiments of the present invention relate to a semiconductor memory device and a method of manufacturing the same and, more particularly, to a semiconductor memory device including a control gate and a method of manufacturing the same.

2. Description of Related Art

In order to achieve a higher integration degree of a NAND flash memory device, a gap between word lines becomes narrower. The narrower gap between the word lines may cause interference therebetween and deteriorate operating characteristics, which will be described below in detail.

FIG. 1 is a cross-sectional view of a conventional semiconductor memory device to illustrate an interference phenomenon.

Referring to FIG. 1, a P-well is formed in a semiconductor substrate. Cells of a NAND flash memory, which include source/drain S/D and cell gates (or word lines), are formed in the P-well. Each of the cell gates (or word lines) has a tunnel insulating layer Tox, a floating gate FG, a dielectric layer IPD and a control gate CG that are sequentially stacked. With increasing integration degree, the distances between the word lines are reduced.

During a program operation, a program voltage Vpgm is applied to a selected word line (i.e., a control gate of a cell gate) among the word lines, while a program pass voltage Vpass is applied to unselected word lines. Here, as distances between the word lines are reduced, interference may occur in unselected floating gates FG2 that are next to the selected word line during the program operation.

More specifically, since an insulating layer (not shown) is formed between a control gate CG1 of the selected word line and the floating gates FG2 of the unselected word lines next to the selected word line, parasitic capacitors Cp1 and Cp1 are formed by the control gate CG1, the dielectric layer IPD and the floating gates FG2. At this time, when the program voltage Vpgm is applied to the control gate CG1 of the selected word line, a high electric field may be applied to the floating gate FG2 of the neighboring word line because of capacitive coupling caused by the parasitic capacitor Cp1, whereby interference may occur. More specifically, the high electric field may cause electrons trapped in the floating gate FG2 to pass through the tunnel insulating layer Tox and be emitted to the substrate (particularly, P-well). Therefore, a threshold voltage of a memory cell that includes the floating gate FG2 may be reduced.

When a threshold voltage of a memory cell that has been programmed is reduced due to interference, data stored in the memory cell may be changed.

BRIEF SUMMARY

Embodiments relate to a semiconductor memory device capable of minimizing interference between a selected memory cell and a neighboring memory cell during a program operation.

A semiconductor memory device according to embodiment of the present invention includes a tunnel insulating layer formed over a semiconductor substrate, a floating gate formed over the tunnel insulating layer, a dielectric layer formed over the floating gate, and a control gate including a third silicon layer formed over the dielectric layer, a fourth silicon layer formed over the third silicon layer, and a conductive layer formed over the fourth silicon layer, wherein the fourth silicon layer has a greater width than the third silicon layer.

A semiconductor memory device according to another embodiment of the present invention includes a tunnel insulating layer formed over a semiconductor substrate, a floating gate including a first silicon layer formed over the tunnel insulating layer and a second silicon layer formed over the first silicon layer, wherein the second silicon layer has a smaller width than the first silicon layer, a dielectric layer formed over the floating gate, and a control gate including a third silicon layer formed over the dielectric layer, a fourth silicon layer formed over the third silicon layer, and a conductive layer formed over the fourth silicon layer, wherein the fourth silicon layer has a greater width than the third silicon layer.

A method of manufacturing a semiconductor memory device according to an embodiment of the present invention includes forming a tunnel insulating layer and a floating gate silicon layer over a semiconductor substrate, forming a trench in an isolation region by etching the floating gate silicon layer, the tunnel insulating layer and the semiconductor substrate, forming an isolation layer in the isolation region in which the trench is formed, forming a dielectric layer, a first silicon layer, a second silicon layer and a conductive layer sequentially over the isolation layer and the floating gate silicon layer, forming a control gate by etching the conductive layer and the second silicon layer and etching the second silicon layer and the dielectric layer, wherein the second silicon layer and the dielectric layer are etched to have widths smaller than a width of the first silicon layer, and forming a floating gate by etching the floating gate silicon layer.

A semiconductor memory device according to an embodiment of the present invention includes a plurality of non-volatile unit cell, each comprising a floating gate, a control gate, and a dielectric layer between the floating gate and the control gate, wherein the dielectric layer has a different width from the floating gate and the control gate, while the floating gate and the control gate have the substantially same width.

DESCRIPTION OF EMBODIMENTS

Hereinafter, various embodiments of the present disclosure will be described in detail with reference to the accompanying drawings. The figures are provided to enable those of ordinary skill in the art to make and use the present invention according to the exemplary embodiments of the present invention.

Figure 1:
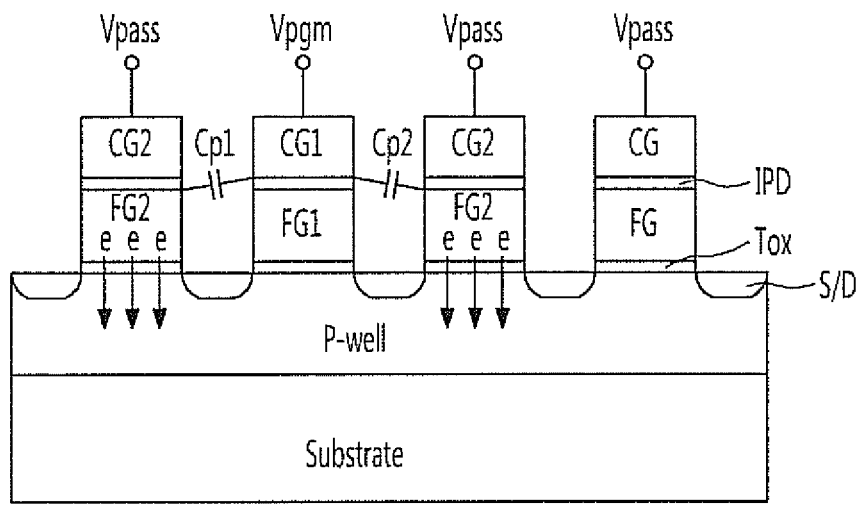
FIG. 1 is a cross-sectional view of a conventional semiconductor memory device to illustrate an interference phenomenon.
Figure 2:
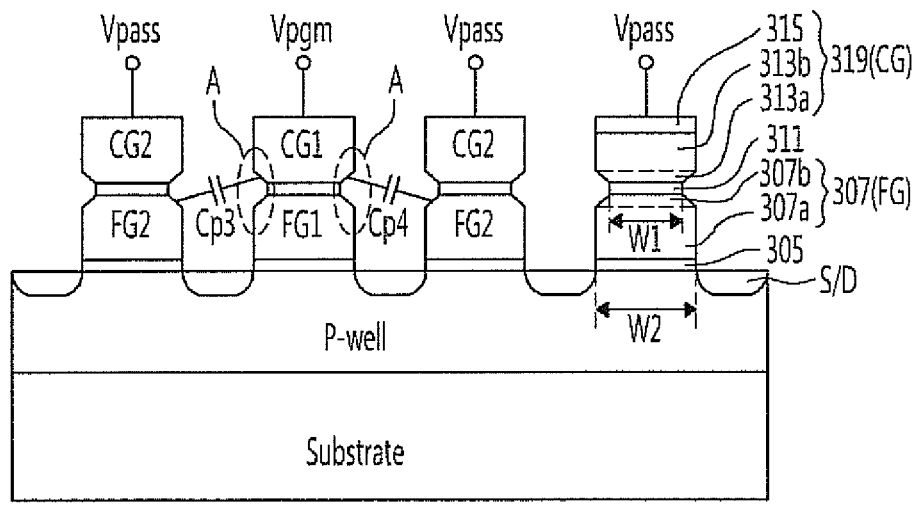
FIG. 2 is a cross-sectional view of a semiconductor memory device according to an embodiment of the present invention.

FIG. 2 is a cross-sectional view of a semiconductor memory device according to an embodiment of the present invention.

Referring to FIG. 2, a P-well is formed in a semiconductor substrate, and cells of a NAND flash memory, which include source/drain S/D and cell gates 319, are formed in the P-well. Each of the cell gates 319 has a tunnel insulating layer 305, a floating gate FG, a dielectric layer 311 and a control gate CG that are sequentially stacked.

The control gate CG includes a first silicon layer 313a formed on the dielectric layer 311, a second silicon layer 313b formed on the first silicon layer 313a, and a conductive layer 315 formed on the second silicon layer 313b. The second silicon layer 313b has a width greater than a width of the first silicon layer 313a.

A width W1 of the dielectric layer 311 is smaller than a width W2 of the second silicon layer 313b included in the control gate CG. In addition, the width W1 of the dielectric layer 311 corresponds to the width W1 of a bottom surface of the first silicon layer 313a contacted with the dielectric layer 311.

The first and second silicon layers 313a and 313b include impurities. During manufacturing processes, in order to form the first silicon layer 313a having a smaller width than the second silicon layer 313b, the first and second silicon layers 313a and 313b may be doped with impurities such that the impurities included in the first silicon layer 313a may have a higher impurity concentration than the impurities included in the second silicon layer 313b.

The first and second silicon layers 313a and 313b may be doped with P-type impurities. Specifically, the first and second silicon layers 313a and 313b may be formed of polysilicon doped with P-type impurities such as Boron.

Etching rates of the first and second silicon layers 313a and 313b may become different due to a difference in impurity concentration of the first and second silicon layers 313a and 313b during an etch process. As a result, an angle of inclination of a sidewall of the first silicon layer 313a may become smaller than that of the second silicon layer 313b.

The floating gate FG has a top width and a bottom width greater than the top width. For example, the floating gate FG may include a third silicon layer 307a and a fourth silicon layer 307b. Here, the fourth silicon layer 307b formed over the third silicon layer 307a has a width smaller than a width of the third silicon layer 307a.

The third and fourth silicon layers 307a and 307b also include impurities. During manufacturing processes, in order to form the fourth silicon layer 307b having a smaller width than the third silicon layer 307a, the third and fourth silicon layers 307a and 307b may be doped with impurities such that the impurities included in the fourth silicon layer 307b may have a higher impurity concentration than the impurities included in the third silicon layer 307a. Here, the third and fourth silicon layers 307a and 307b may be doped with P-type impurities such as Boron. Specifically, each of the third and fourth silicon layers 307a and 307b may comprise a silicon layer containing P-type impurities. Particularly, the third silicon layer 307a may comprise an amorphous silicon layer. The fourth silicon layer 307b may comprise a polysilicon layer.

Etching rates of the third and fourth silicon layers 307a and 307b may become different due to a difference in impurity concentration of the third and fourth silicon layers 307a and 307b during an etch process. As a result, an angle of inclination of a sidewall of the fourth silicon layer 307b may become smaller than that of the third silicon layer 307a.

As described above, as both lower corners of control gate CG and both upper corners of a floating gate FG are rounded with small angles of inclination 'A', the distances between a control gate CG1 of a word line, i.e., selected one from among a plurality of word lines, and floating gates FG2 of neighboring, i.e., unselected word lines next to the selected word line, may increase. As a result, parasitic capacitances of parasitic capacitors Cp3 and Cp4 that may be respectively formed between the control gate CG1 and the floating gates FG2 may be reduced.

An electric field applied to the neighboring floating gates FG2 may be reduced due to capacitive coupling of the program voltage Vpgm, when a program voltage Vpgm is applied to the control gate CG1 of the selected word line, and a program pass voltage Vpass is applied to control gates CG2 of the unselected word lines next to the selected word line during a program operation. In particular, as both lower corners of the control gate CG are rounded, the concentration of an electric field at the lower corners may be prevented to thus further reduce the electric field applied to the floating gates FG2. Therefore, electrons may not be emitted from the floating gates FG2 or emission of electrons may be minimized, thereby improving operating characteristics and reliability.

Hereinafter, a method of manufacturing the semiconductor memory device having the above-described structure will be described below.

FIGS. 3A to 3F are cross-sectional views illustrating a method of manufacturing a semiconductor memory device according to an embodiment of the present invention.

Figure 3A:
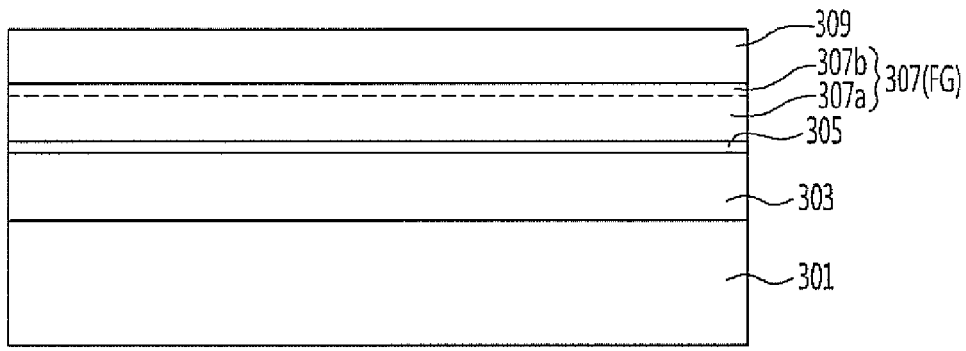
FIGS. 3A to 3F are cross-sectional views illustrating a method of manufacturing a semiconductor memory device according to an embodiment of the present invention.

Referring to FIG. 3A, a P-well 303 is formed in a cell region of a semiconductor substrate 301. The tunnel insulating layer 305, a floating gate silicon layer 307 and a first hard mask layer 309 are sequentially formed in the P-well 303.

The floating gate silicon layer 307 comprises a first silicon layer 307a and a second silicon layer 307b that are stacked on the tunnel insulating layer 305. An additive gas that contains impurities may be supplied during a process of forming the floating gate silicon layer 307 to include the impurities in the floating gate silicon layer 307. Here, the additive gas may include P-type impurities such as Boron. P-type impurities may be included in only the second silicon layer 307b, or both the first and second silicon layers 307a and 307b. Most importantly, in order that the second silicon layer 307b has a higher impurity concentration than the first silicon layer 307a, the amount of the additive gas containing impurities being supplied is more increased, when the second silicon layer 307b is formed, rather than when the first silicon layer 307a is formed.

The first silicon layer 307a may be formed of amorphous silicon, and the second silicon layer 307b may be formed of polysilicon.

The first hard mask layer 309 is in the form of a pattern having openings that define isolation regions. The floating gate silicon layer 307 in the isolation regions is exposed through the openings. Here, the openings of the first hard mask layer 309 are in the form of lines arranged in parallel with each other.

Subsequently, the floating gate silicon layer 307, the tunnel insulating layer 305 and the semiconductor substrate 301 are etched by an etching process using the first hard mask layer 309 as an etch mask to form trenches (not shown) in the isolation regions of the semiconductor substrate 301. The trenches are in the form of lines substantially the same as the openings of the first hard mask layer 309. Since FIG. 3A illustrates a cross-section of the semiconductor substrate between the trenches, the trenches are not shown. Subsequently, isolation layers (not shown) are formed in the isolation regions of the semiconductor substrate 301 where the trenches are formed. Since a process of forming these isolation layers is widely known to people skilled in the art, a detailed description thereof will be omitted.

In this manner, the isolation layers (not shown) are formed in the isolation regions of the semiconductor substrate 301. The isolation layers have a shape of parallel lines. In addition, the tunnel insulating layer 305 and the floating gate silicon layer 307 are also formed in a shape of parallel lines in active regions of the semiconductor substrate 301 that are defined between the isolation layers.

Figure 3B:
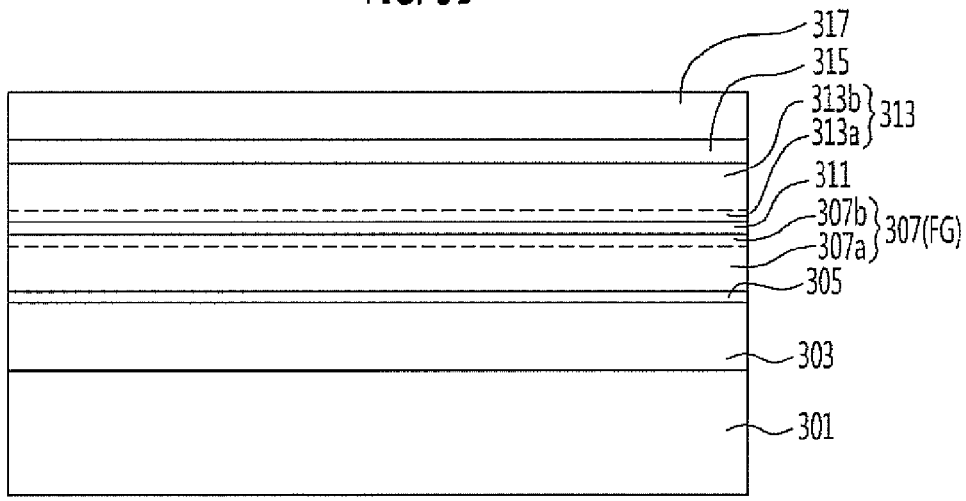

Referring to FIG. 3B, the first hard mask layer 309 is removed, and a dielectric layer 311, a control gate silicon layer 313 and a second hard mask layer 317 are formed over the semiconductor substrate 301 including the isolation layers (not shown) and the floating gate silicon layer 307.

The dielectric layer 311 may comprise an oxide layer, a nitride layer and an oxide layer that are stacked. Here, an insulating layer with a high dielectric constant may be added in the dielectric layer 311, or replace the nitride layer of the dielectric layer 311.

The control gate silicon layer 313 may comprise a third silicon layer 313a and a fourth silicon layer 313b that are stacked. Here, the third silicon layer 313a is formed over the dielectric layer 311. The fourth silicon layer 313b is formed over the third silicon layer 313a. The third silicon layer 313a and the fourth silicon layer 313b may be formed of polysilicon. An additive gas that contains impurities may be supplied to dope the control gate silicon layer 313 with impurities during a process of forming the control gate silicon, layer 313. At this time, an additive gas that contains P-type impurities such as Boron may be supplied. In particular, the third silicon layer 313a may have a higher impurity concentration than the fourth silicon layer 313b by increasing the amount of the additive gas containing P-type impurities when the third silicon layer 313a is formed, rather than when the fourth silicon layer 313b is formed.

Instead of the P-type impurities, N-type impurities may be included in the floating gate silicon layer 307 and the control gate silicon layer 313.

The conductive layer 315 may be formed of a metal such as tungsten. In addition, the conductive layer 315 may comprise a silicide layer. The conductive layer 315 may comprise a metal silicide layer such as a tungsten silicide layer, a cobalt silicide layer, or a titanium silicide layer.

The second hard mask layer 317 has openings (not shown) that define (or expose) regions in which word lines (or control gates) will be formed. The openings of the second hard mask layer 317 cross the openings of the first hard mask layer 309 as shown in FIG. 3A.

Figure 3C:
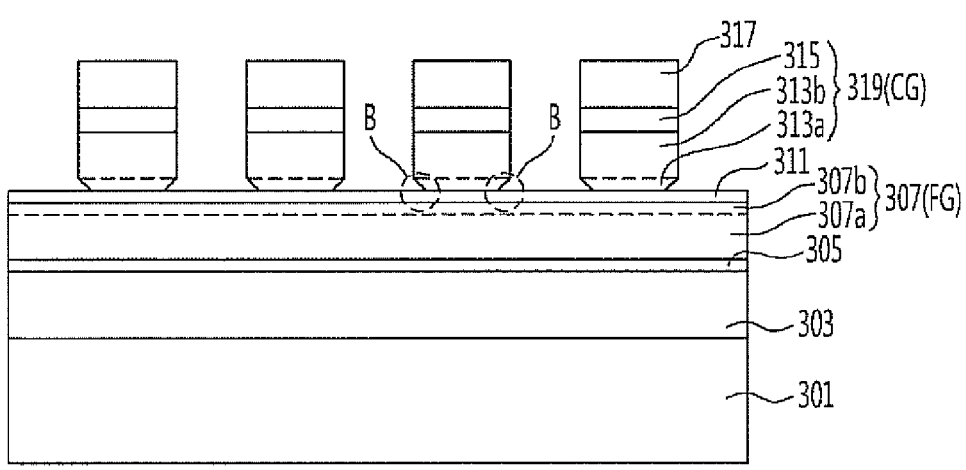

Referring to FIG. 3C, the conductive layer 315 and the silicon layers 313a and 313b are sequentially etched by an etching process using the second hard mask layer 317 as an etch mask. As a result, stacked patterns 319 or the control gates CG are formed of the silicon layers 313a and 313b and the conductive layer 315 that are stacked.

When the silicon layers 313a and 313b are etched, the third silicon layer 313a doped with the impurities having a higher impurity concentration than the impurities of the fourth silicon layer 313b is etched more quickly than the fourth silicon layer 313b. In other words, when the third silicon layer 313a and the fourth silicon layer 313b are etched to form the control gates CG, an angle of inclination of sidewalls of the fourth silicon layer 313b is nearly perpendicular to the substrate 301, and an angle of inclination of the sidewalls B of the third silicon layer 313a becomes smaller than that of the fourth silicon layer 313b. In particular, an etched angle of inclination of lower sidewalls of each control gate CG is determined by a thickness of the third silicon layer 313a.

Therefore, while the control gates CG includes the third silicon layer 313a and the fourth silicon layer 313b, the width of the third silicon layer 313a is smaller than the width of the fourth silicon layer 313b.

Figure 3D:
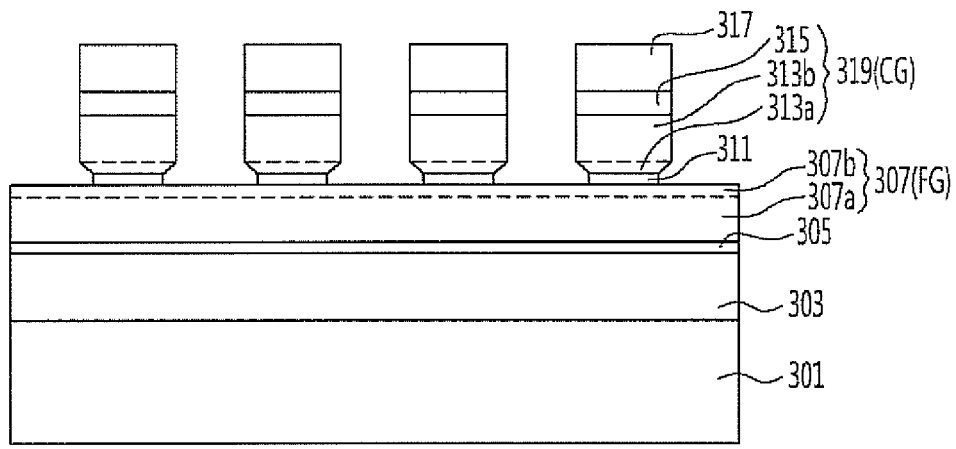

Referring to FIG. 3D, the dielectric layer 311 is etched by an etching process using the control gates CG or the second hard mask layer 317 as an etch mask, so that the dielectric layer 311 exposed between the control gates CG may be removed. At this time, a width of the dielectric layer 311 that remains under the control gates CG may correspond to a width of a bottom surface of the third silicon layer 313a contacted with the dielectric layer 311.

Figure 3E:
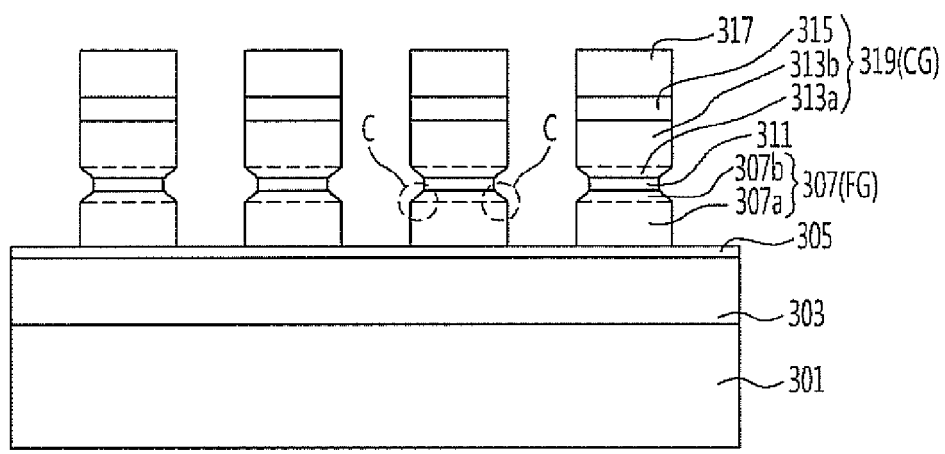

With reference to FIG. 3E, the floating gate silicon layer 307 is etched by an etch process using the control gates CG or the second hard mask layer 317 as an etch mask, whereby the floating gates FG are formed of the first and second silicon layers 307a and 307b that are patterned by the etch process.

When the silicon layers 307b and 307a are etched, the second silicon layer 307b doped with the impurities having higher impurity concentration than the impurities of the first silicon layer 307a is etched more quickly than the first silicon layer 307a . . . . In other words, when the second silicon layer 307b and the first silicon layer 307a are etched to form the floating gates FG, an angle of inclination of sidewalls of the first silicon layer 307a is nearly perpendicular to the substrate 301, and an angle of inclination of the sidewalls C of the second silicon layer 307b becomes smaller than that of the first silicon layer 307a. In particular, an angle of inclination of upper sidewalls of each floating gate FG to be etched is determined by a thickness of the second silicon layer 307b.

While the floating gate FG includes the first silicon layer 307a and the second silicon layer 307b, the width of the second silicon layer 307b is smaller than the width of the first silicon layer 307a.

Through the aforementioned processes, the control gate CG has a top width greater than a bottom width; the floating gate FG has a top width smaller than a bottom width; and the width of the dielectric layer 311 corresponds to the smaller top or bottom width. Accordingly, a cross-section of a gate (or a word line) of a memory cell is shaped like a sandglass. In other words, the memory cell has top and bottom portions connected by a narrower middle portion. In addition, the distances between the control gates CG and the floating gates FG of adjacent cell gates (or word lines) may reduce interference therebetween.

Figure 3F:
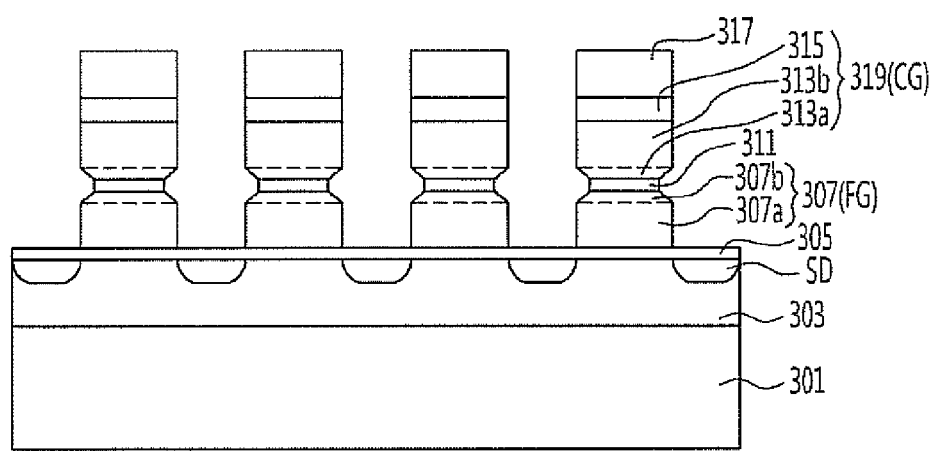

Referring to FIG. 3F, N-type impurities are injected into the semiconductor substrate 301 by performing an ion implantation process to form source/drain S/D. Subsequently, an interlayer insulating layer (not shown) is formed, and wires may be formed over the interlayer insulating layer.

According to an embodiment of the present invention, interference that may occur between a selected memory cell and a neighboring memory cell during a program operation may be minimized to thus improve operating characteristics and reliability.

What is claimed is:

1. A semiconductor memory device, comprising:
   a tunnel insulating layer formed over a semiconductor substrate;
   a floating gate formed over the tunnel insulating layer;
   a dielectric layer formed over the floating gate; and
   a control gate including a third silicon layer formed over the dielectric layer, a fourth silicon layer formed over the third silicon layer, and a conductive layer formed over the fourth silicon layer,
   wherein the fourth silicon layer has a greater width than the third silicon layer, and wherein impurities included in the third silicon layer have a higher impurity concentration than impurities included in the fourth silicon layer.

2. The semiconductor memory device of claim 1, wherein a top width of the floating gate is smaller than a bottom width thereof.

3. The semiconductor memory device of claim 1, wherein the floating gate includes a first silicon layer and a second silicon layer formed over the first silicon layer and having a width smaller than a width of the first silicon layer.

4. A semiconductor memory device, comprising:
a tunnel insulating layer formed over a semiconductor substrate;
a floating gate including a first silicon layer formed over the tunnel insulating layer and a second silicon layer formed over the first silicon layer, wherein the second silicon layer has a smaller width than the first silicon layer;
a dielectric layer farmed over the floating gate; and
a control gate including a third silicon layer formed over the dielectric layer, a fourth silicon layer formed over the third silicon layer, and a conductive layer formed over the fourth silicon layer,
wherein the fourth silicon layer has a greater width than the third silicon layer, and
wherein impurities included in the third silicon layer have a higher impurity concentration than impurities included in the fourth silicon layer.

5. The semiconductor memory device of claim 1 or 4, wherein a width of the dielectric layer is smaller than the width of the fourth silicon layer included in the control gate.

6. The semiconductor memory device of claim 5, wherein the width of the dielectric layer corresponds to a width of a bottom surface of the third silicon layer coming into contact with the dielectric layer.

7. The semiconductor memory device of claim 1, wherein the third silicon layer and the fourth silicon layer are formed of polysilicon doped with P-type impurities.

8. The semiconductor memory device of claim 4, wherein the third and fourth silicon layers are formed of polysilicon doped with P-type impurities.

9. The semiconductor memory device of claim 1 or 4, wherein an angle of inclination of a sidewall of the third silicon layer is smaller than an angle of a sidewall of the fourth silicon layer.

10. The semiconductor memory device of claim 3 or 4, wherein impurities included in the second silicon layer have a higher impurity concentration than impurities included in the first silicon layer.

11. The semiconductor memory device of claim 10, wherein each of the first and second silicon layers comprises a silicon layer containing P-type impurities.

12. The semiconductor memory device of claim 3 or 4, wherein an angle of inclination of a sidewall of the second silicon layer is smaller than an angle of inclination of a sidewall of the first silicon layer.

13. The semiconductor memory device of claim 3 or 4, wherein the first silicon layer comprises an amorphous silicon layer, and the second silicon layer comprises a polysilicon layer.

14. The semiconductor memory device of claim 4,
wherein a width of the dielectric layer is smaller than the width of the first silicon layer of the floating gate.

15. The semiconductor memory device of claim 14, wherein the width of the dielectric layer corresponds to a width of a top surface of the second silicon layer of the floating gate that is in contact with the dielectric layer and the control gate.

16. The semiconductor memory device of claim 15, wherein the control gate and the floating gate respectively comprises a contact portion which has the same width with the dielectric layer.

17. The semiconductor memory device of claim 16, wherein the contact portion comprises a doped silicon.

* * * * *